United States Patent
Qiao et al.

(10) Patent No.: US 10,862,061 B2
(45) Date of Patent: Dec. 8, 2020

(54) ORGANIC LIGHT-EMITTING DISPLAY PANEL AND ORGANIC LIGHT-EMITTING DISPLAY DEVICE HAVING GRADIENT DOPED ELECTRON TRANSMISSION REGIONS

(71) Applicant: Shanghai Tianma AM-OLED Co., Ltd., Shanghai (CN)

(72) Inventors: Weili Qiao, Shanghai (CN); Jinghua Niu, Shanghai (CN); Xiangcheng Wang, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 64 days.

(21) Appl. No.: 16/215,820

(22) Filed: Dec. 11, 2018

(65) Prior Publication Data

US 2019/0372044 A1  Dec. 5, 2019

(30) Foreign Application Priority Data

May 31, 2018 (CN) .......................... 2018 1 0550601

(51) Int. Cl.
*H01L 29/08* (2006.01)
*H01L 51/50* (2006.01)
*H01L 27/32* (2006.01)

(52) U.S. Cl.
CPC ............ *H01L 51/508* (2013.01); *H01L 27/32* (2013.01); *H01L 51/5012* (2013.01); *H01L 51/5076* (2013.01); *H01L 51/5092* (2013.01)

(58) Field of Classification Search
CPC ..... H01L 51/508; H01L 27/32; H01L 257/40; H01L 51/5012; H01L 51/5076; H01L 51/5092; H01L 51/5004

(Continued)

(56) References Cited

U.S. PATENT DOCUMENTS

2005/0173700 A1* 8/2005 Liao ................. H01L 27/3211
257/40
2006/0269787 A1* 11/2006 Chen ................. H01L 51/5052
428/690

(Continued)

FOREIGN PATENT DOCUMENTS

| CN | 103594659 A | 2/2014 |
| CN | 106601921 A | 4/2017 |

(Continued)

OTHER PUBLICATIONS

Chinese Office Action dated May 27, 2019 for corresponding Chinese Patent Application No. 201810550601.8.

*Primary Examiner* — Caleb E Henry
(74) *Attorney, Agent, or Firm* — Tarolli, Sundheim, Covell & Tummino LLP (57) ABSTRACT

Provided is an organic light-emitting display panel, including an array substrate and an organic light-emitting component. The array substrate includes a plurality of driving elements, and the organic light-emitting component is arranged to be associated with the driving element. The organic light-emitting component includes an anode and a cathode, and an organic functional layer therebetween. The organic functional layer includes an organic light-emitting layer, and an electron transmission region between the cathode and the organic light-emitting layer. The electron transmission region is doped with a first dopant comprising alkaline earth metal or rare earth metal elements. The electron transmission region includes first and second electron transmission layers. The doping concentrations C1, C2 of the first dopant in the first and second electron transmission layers satisfy: $0 \leq C2 < C1$. The electron transmission region can be at the same time matched with the cathode and the organic light-emitting layer.

20 Claims, 4 Drawing Sheets

(58) Field of Classification Search
USPC .......................................................... 257/40
See application file for complete search history.

(56) References Cited

U.S. PATENT DOCUMENTS

2019/0165292 A1* 5/2019 Hong ................... H01L 51/5072
2019/0372046 A1* 12/2019 Edman ................ H01L 51/5004

FOREIGN PATENT DOCUMENTS

| CN | 106784355 A | 5/2017 |
| CN | 107579159 A | 1/2018 |

* cited by examiner

ORGANIC LIGHT-EMITTING DISPLAY PANEL AND ORGANIC LIGHT-EMITTING DISPLAY DEVICE HAVING GRADIENT DOPED ELECTRON TRANSMISSION REGIONS

CROSS-REFERENCE TO RELATED APPLICATIONS

The present application claims the benefit of priority to Chinese Patent Application No. 201810550601.8, filed on May 31, 2018, the content of which is incorporated herein by reference in its entirety.

TECHNICAL FIELD

The present disclosure relates to the field of display technologies and, in particular, to an organic light-emitting display panel and an organic light-emitting display device.

BACKGROUND

With the booming development of the planar display technologies, the organic light-emitting display device is becoming more widely used due to its excellent characteristics of self-luminous, high brightness, large angle of view, rapid response, etc.

The organic light-emitting device includes a plurality of organic light-emitting components. The organic light-emitting components include an anode, an organic light-emitting layer, an electron transmission layer and a cathode arranged to be stacked in sequence. During the working process of the organic light-emitting components, the cathode generates electrons, and the anode generates holes. Under the effect of an electrical field between the cathode and the anode, the holes move towards the organic light-emitting layer, and the electrons move towards the organic light-emitting layer through the electron transmission layer, when the holes and the electrons meet each other in the organic light-emitting layer, they are recombined to release energy to let the organic light-emitting component emit light.

Generally, in the related art, in order to improve the electron transmission capacity of the electron transmission layer, the electron transmission layer is doped to have a certain doping concentration. However, the inventor of the present disclosure has found that, the electron transmission layer in the related art cannot be at the same time matched with both the cathode and the organic light-emitting layer located at two sides thereof, resulting in that the luminescent effect of the organic light-emitting component is poor.

SUMMARY

Embodiments of the present disclosure provide an organic light-emitting display panel and an organic light-emitting display device, which can be at the same time matching with the cathode and the organic light-emitting layer located at two sides thereof, thereby improving luminescent effect of the organic light-emitting component.

In an aspect, embodiments of the present disclosure provide an organic light-emitting display panel, including: an array substrate comprising a plurality of driving elements; a plurality of organic light-emitting components arranged to be associated with the plurality of driving elements, wherein the organic light-emitting components each have an anode, a cathode and an organic functional layer between the anode and the cathode, wherein the organic functional layer comprises an organic light-emitting layer and an electron transmission region between the cathode and the organic light-emitting layer, wherein the electron transmission region is doped with a first dopant, and the first dopant comprises alkaline earth metal elements or rare earth metal elements; and wherein the electron transmission region comprises a first electron transmission layer and a second electron transmission layer, a doping concentration $C_1$ of the first dopant in the first electron transmission layer and a doping concentration $C_2$ of the first dopant in the second electron transmission layer satisfy following condition: $0 \leq C_2 < C_1$.

The first electron transmission layer is located between the second electron transmission layer and the cathode.

The second electron transmission layer is undoped with the first dopant.

$C_2$ is variable so that a doping concentration of the first dopant at a side of the second electron transmission layer close to the first electron transmission layer is higher than a doping concentration of the first dopant at a side of the second electron transmission layer away from the first electron transmission layer.

$C_1$ is variable so that a doping concentration of the first dopant at a side of the first electron transmission layer close to the cathode is higher than a doping concentration of the first dopant at a side of the first electron transmission layer away from the cathode.

A basis material of the second electron transmission layer is the same as a basis material of the first electron transmission layer.

The electron transmission region further comprises a third electron transmission layer adjacent to the organic light-emitting layer, and the third electron transmission layer is undoped with the first dopant.

A highest occupied molecular orbital $HOMO1$ of the third electron transmission layer and a highest occupied molecular orbital $HOMO2$ of a host material of the organic light-emitting layer satisfy: $|HOMO1 - HOMO2| < 1$ eV.

The basis material of the second electron transmission layer is the same as a material of the third electron transmission layer.

The organic light-emitting component further comprises an electron injection layer between the cathode and the electron transmission region, and the electron injection layer is made of at least one of an alkaline earth metal or a rare earth metal.

A thickness d of the electron transmission layer is d, wherein $d \leq 5$ nm.

The first dopant comprises at least one of Mg, Ga, Yb, Sm, Y, Tm, Gd and Lu.

The first dopant is an alkaline earth elementary metal or a rare earth elementary metal.

The first dopant is a metal oxide containing alkaline earth metal elements or rare earth metal elements, or the first dopant is a metal halide containing alkaline earth metal elements or rare earth metal elements, or the first dopant is metal complex containing alkaline earth metal elements or rare earth metal elements.

In another aspect, embodiments of the present disclosure provide an organic light-emitting display device, including any one of the above organic light-emitting display panels.

An embodiment of the present disclosure provides an organic light-emitting display panel and an organic light-emitting display device. The organic light-emitting display panel includes an electron transmission region between the cathode and the organic light-emitting layer. The electron transmission region is doped with a first dopant, and the first dopant contains alkaline earth metal elements or rare earth metal elements. The electron transmission region includes a first electron transmission layer and a second electron transmission layer. The doping concentration C1 of the first dopant in the first electron transmission layer and the doping concentration C2 of the first dopant in the second electron transmission layer satisfy: $0 \leq C2 < C1$, that is, the electron transmission region is gradient doped, so that the doping concentration at a side (one of the first electron transmission layer and the second electron transmission layer) of the electron transmission region close to the cathode is different from the doping concentration at a side (the other one of the first electron transmission layer and the second electron transmission layer) of the electron transmission region close to the organic light-emitting layer, thus the electron transmission region can be at the same time matched with the cathode and the organic light-emitting layer at two sides thereof, which is beneficial to improving the luminescent effect of the organic light-emitting component, and improving the display effect of the organic light-emitting display panel.

BRIEF DESCRIPTION OF DRAWINGS

In order to illustrate technical solutions of embodiments of the present disclosure or the related art more clearly, the accompanying drawings used in the embodiments or the related art will be briefly introduced hereinafter. Obviously, the drawings described are only some of the embodiments of the present disclosure, on the basis of these drawings, those of ordinary skill in the art can also obtain other drawings without creative efforts.

DESCRIPTION OF EMBODIMENTS

In order to make objects, technical solutions and advantages of the present disclosure more clearly, the technical solutions in the embodiments of the present disclosure will be described clearly and completely with reference to the drawings in the embodiments of the present disclosure. Obviously, the described embodiments are only part of the embodiments, rather than all of them. Based on the embodiments of the present disclosure, any other embodiments obtained by those of ordinary skill in the art shall fall in the protection scope of the present disclosure.

It should be noted that, unless conflicts exist, the technical features in the embodiments of the present disclosure can be combined with each other.

Figure 1:
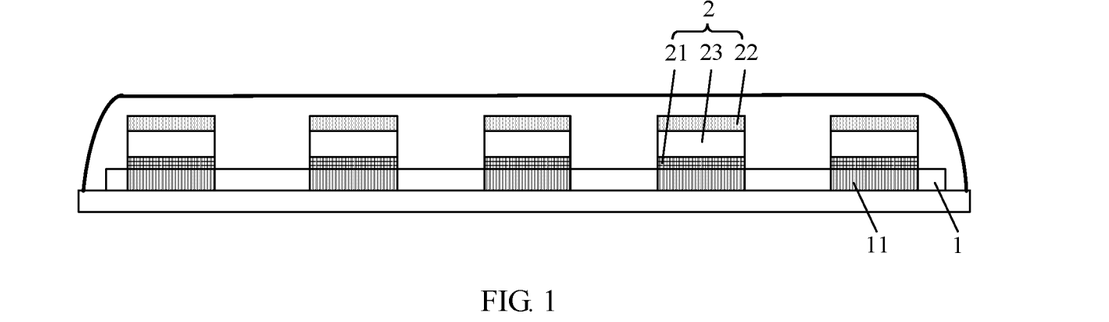
FIG. 1 illustrates a cross-sectional view of an organic light-emitting display panel according to an embodiment of the present disclosure.
Figure 2:
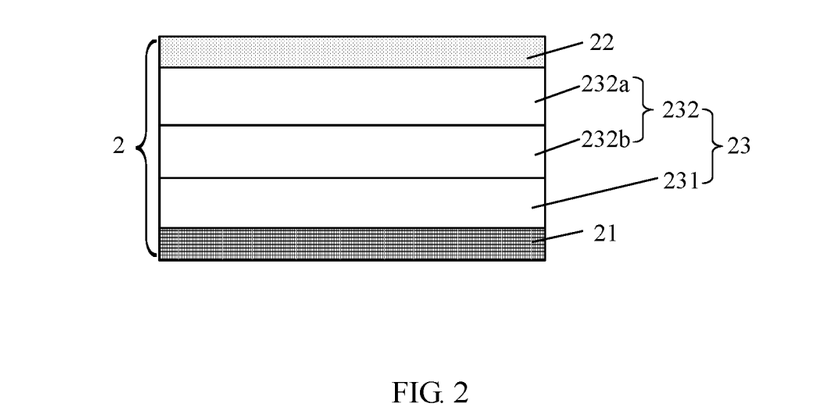
FIG. 2 illustrates a first cross-sectional view of an organic light-emitting component according to an embodiment of the present disclosure.
Figure 3:
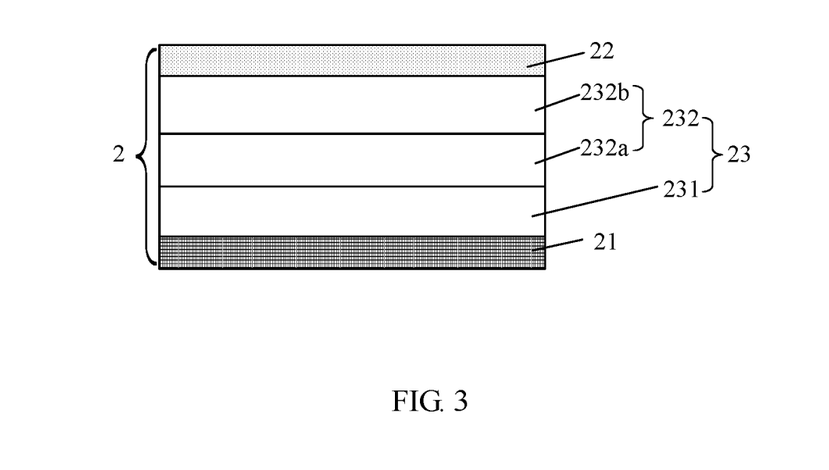
FIG. 3 illustrates a second cross-sectional view of an organic light-emitting component according to an embodiment of the present disclosure.

An embodiment of the present disclosure provides an organic light-emitting display panel, as shown in FIGS. 1-3. FIG. 1 illustrates a cross-sectional view of an organic light-emitting display panel according to an embodiment of the present disclosure, FIG. 2 illustrates a first cross-sectional view of an organic light-emitting component according to an embodiment of the present disclosure, and FIG. 3 illustrates a second cross-sectional view of an organic light-emitting component according to an embodiment of the present disclosure. The organic light-emitting display panel includes an array substrate 1 and an organic light-emitting component 2. The array substrate 1 includes a plurality of driving elements 11, and the organic light-emitting component 2 is arranged corresponding to the driving element 11. The organic light-emitting component 2 includes an anode 21 and a cathode 22, and an organic functional layer 23 between the anode 21 and the cathode 22. The organic functional layer 23 includes an organic light-emitting layer 231, and an electron transmission region 232 between the cathode 22 and the organic light-emitting layer 231. The electron transmission region 232 is doped with a first dopant, and the first dopant contains alkaline earth metal elements or rare earth metal elements. The electron transmission region 232 includes a first electron transmission layer 232a and a second electron transmission layer 232b. The doping concentration C1 of the first dopant in the first electron transmission layer 232a and the doping concentration C2 of the first dopant in the second electron transmission layer 232b meet the following requirement: $0 \leq C2 < C1$.

During the working process of the organic light-emitting component 2, the cathode 22 generates electrons, and the anode 21 generates holes. Under the effect of an electrical field between the cathode 22 and the anode 21, the holes move towards the organic light-emitting layer 231, and the electrons move towards the organic light-emitting layer 231 through the electron transmission layer 232. When the holes and the electrons meet each other in the organic light-emitting layer 231, they are recombined to release energy to let the organic light-emitting component 2 emit light. The organic light-emitting component 2 can be an organic light-emitting diode (OLED).

The first dopant doped in the electron transmission region 232 can reduce the injection barrier of the electron, improve the electron transfer rate, and thus can effectively improve the electron transmission capacity of the electron transmission region 232, which facilitates improving the luminescent effect of the organic light-emitting component and thus improving the display effect of the organic light-emitting display panel.

In the organic light-emitting display panel having the above described structure, the electron transmission region 232 is gradient-doped, so that the doping concentration at a side (one of the first electron transmission layer 232a and the second electron transmission layer 232b) of the electron transmission region 232 close to the cathode 22 is different from the doping concentration at a side (the other one of the first electron transmission layer 232a and the second electron transmission layer 232b) of the electron transmission region 232 close to the organic light-emitting layer 231, thus the electron transmission region 232 can be at the same time matched with both the cathode 22 and the organic light-emitting layer 231 at two sides thereof, which is beneficial to improve the luminescent effect of the organic light-emitting component 2, and thus improve the display effect of the organic light-emitting display panel.

In a direction towards the cathode 22, the first electron transmission layer 232a and the second electron transmission layer 232b of the electron transmission region 232 can be stacked in many manners. For example, as shown in FIG. 2, the first electron transmission layer 232a is located between the second electron transmission layer 232b and the cathode 22. Alternatively, as shown in FIG. 3, the second electron transmission layer 232b is located between the first electron transmission layer 232a and the cathode 22.

The situation that the doping concentration C1 of the first dopant in the first electron transmission layer 232a and the doping concentration C2 of the first dopant in the second electron transmission layer 232b meet the following requirement: $0 \leq C2 < C1$ can also be achieved in many manners. For example, the doping concentration C1 of the first dopant in the first electron transmission layer 232a is higher than the doping concentration C2 of the first dopant in the second electron transmission layer 232b, and the doping concentration C2 of the first dopant in the second electron transmission layer 232b is higher than zero. That is, the first electron transmission layer 232a and the second electron transmission layer 232b are both doped with the first dopant. Alternatively, the doping concentration C1 of the first dopant in the first electron transmission layer 232a is higher than the doping concentration C2 of the first dopant in the second electron transmission layer 232b, and the doping concentration C2 of the first dopant in the second electron transmission layer 232b is zero. That is, the first electron transmission layer 232a is doped with the first dopant, but the second electron transmission layer 232b is not doped with the first dopant.

Optionally, as shown in FIG. 2, the first electron transmission layer 232a is located between the second electron transmission layer 232b and the cathode 22. Since the doping concentration C1 of the first dopant in the first electron transmission layer 232a is higher than the doping concentration C2 of the first dopant in the second electron transmission layer 232b, such arrangement can achieve that the doping concentration at the side (i.e., the first electron transmission layer 232a) of the electron transmission region 232 close to the cathode 22 is relatively large, and the doping concentration at the side (i.e., the second electron transmission layer 232b) of the electron transmission region 232 close to the organic light-emitting layer 231 is relatively small, thus the electrons can easily be injected into the electron transmission region 232, and the electron transmission capacity of the electron transmission region 232 is better. Moreover, the contact between the first dopant and the organic light-emitting layer 231 can be avoided as far as possible, so as to prevent the adverse influence of the first dopant on the organic light-emitting layer 231.

On this basis, the doping concentration of the first dopant in the first electron transmission layer 232a can be set in several manners and, similarly, the doping concentration of the first dopant in the second electron transmission layer 232b can also be set in several manners. The first dopant in the first electron transmission layer 232a can be gradient-doped or uniform-doped, and the first dopant in the second electron transmission layer 232b can be gradient-doped or uniform-doped or not doped.

For example, the second electron transmission layer 232b is not doped with the first dopant, so as to avoid contact between the first dopant and the organic light-emitting layer 231, thereby preventing adverse influence of the first dopant on the organic light-emitting layer 231.

For another example, the doping concentration of the first dopant at a side of the second electron transmission layer 232b close to the first electron transmission layer 232a is higher than the doping concentration of the first dopant at a side of the second electron transmission layer 232b away from the first electron transmission layer 232a, so that the second electron transmission layer 232b is gradient doped, so as to better improve the electron transmission capacity of the electron transmission region 232.

For still another example, the doping concentration of the first dopant at a side of the first electron transmission layer 232a close to the cathode 22 is higher than the doping concentration of the first dopant at a side of the first electron transmission layer 232a away from the cathode 22, so that the second electron transmission layer 232b is gradient-doped, so as to better improve the electron transmission capacity of the electron transmission region 232, reduce the working voltage of the organic light-emitting display panel (compared to the situation of not being gradient doped, the working voltage can be reduced from 100% to 97%), increase the luminescent effect of the organic light-emitting component 2 (compared to the situation of not being gradient-doped, the luminescent effect can be increased from 100% to 105%), and improve the service life of the organic light-emitting component 2 (compared to the situation of not being gradient-doped, the service life can be improved from 100% to 104%).

For still another example, the doping concentration of the first dopant at each position of the first electron transmission layer 232a is the same, that is, the first dopant is uniformly doped in the first electron transmission layer 232a, and the doping concentration of the first dopant at each position of the second electron transmission layer 232b is the same, that is, the first dopant is uniformly doped in the second electron transmission layer 232b.

It should be noted that, if there is no conflict, the contents in the above examples can be combined with each other.

For example, as shown in FIG. 2, when the first electron transmission layer 232a is located between the second electron transmission layer 232b and the cathode 22, the doping concentration C1 of the first dopant in the first electron transmission layer 232a is in a range of 10%-50%, the thickness of the first electron transmission layer 232a is less than or equal to 10 Å, and the doping concentration C2 of the first dopant in the second electron transmission layer 232b is in a range of 1%-5%, and the thickness of the second electron transmission layer 232b is less than or equal to 350 Å. It should be noted that, no matter the first dopant in the first electron transmission layer 232a or the second electron transmission layer 232b is uniform-doped or gradient-doped, the doping concentration of the first dopant in each position of the first electron transmission layer 232a or the second electron transmission layer 232b satisfies the above ranges.

Optionally, as shown in FIG. 3, the second electron transmission layer 232b is located between the first electron transmission layer 232a and the cathode 22. In this case, those skilled in the art may refer to the setting manner of the doping concentration of the first dopant for the first and second electron transmission layers 232a, 232b in the situation that the first electron transmission layer 232a is located between the second electron transmission layer 232b and the cathode 22, which will not be repeated herein.

Optionally, in the present disclosure, the basis material of the second electron transmission layer 232b is the same as the basis material of the first electron transmission layer 232a, without the need of changing the target material of the basis material or the target material of the first dopant when forming the first electron transmission layer 232a and the second electron transmission layer 232b by vapor deposition, thus the vapor deposition process is simple. Moreover, the second electron transmission layer 232b and the first electron transmission layer 232a have good compatibility with same electron injection barrier, so that the electron transmission capacity of the electron transmission region 232 is good. For example, the basis material of the first electron transmission layer 232a and the basis material of the second electron transmission layer 232b can both comprise one or more of the following functional groups: dipyridyl, triazine ring, lithium quinoline, carbazole, thiophene, or fluorene.

Figure 4:
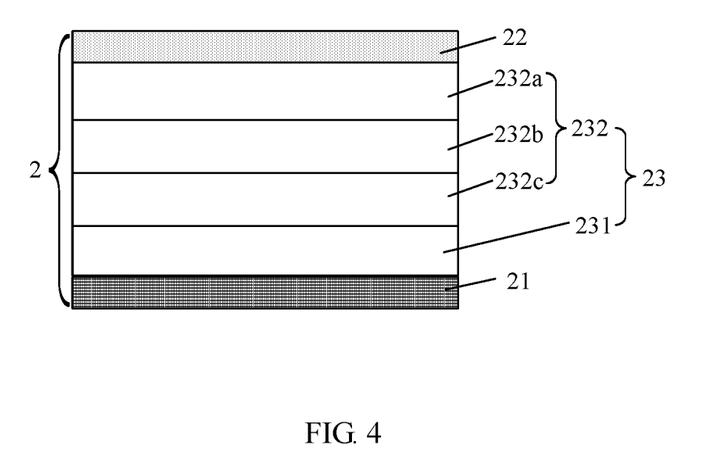
FIG. 4 illustrates a third cross-sectional view of an organic light-emitting component according to an embodiment of the present disclosure.
Figure 5:
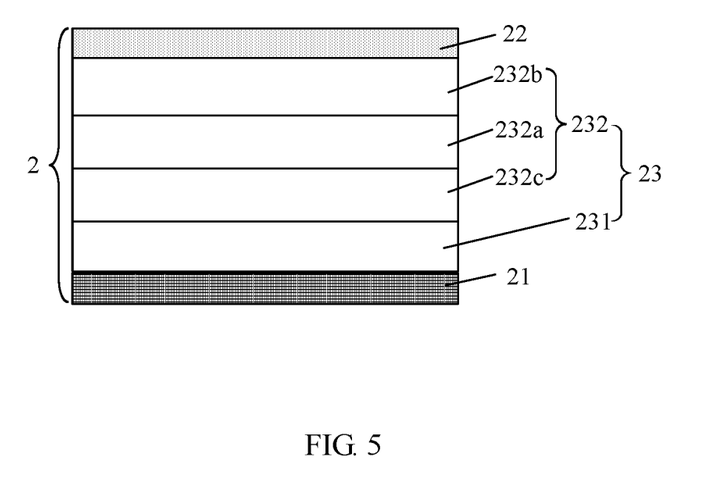
FIG. 5 illustrates a fourth cross-sectional view of an organic light-emitting component according to an embodiment of the present disclosure.

In addition, as shown in FIG. 4 and FIG. 5, FIG. 4 illustrates a third cross-sectional view of an organic light-emitting component according to an embodiment of the present disclosure, and FIG. 5 illustrates a fourth cross-sectional view of an organic light-emitting component according to an embodiment of the present disclosure. In the present disclosure, the electron transmission region 232 further includes a third electron transmission layer 232c arranged adjacent to the organic light-emitting layer 231, and the third electron transmission layer 232c is not doped with the first dopant, so as to avoid the contact between the first dopant and the organic light-emitting layer 231, thereby preventing adverse influence of the first dopant on the organic light-emitting layer 231. In this case, the stacking manner of the electron transmission region 232 can be: as shown in FIG. 4, the third electron transmission layer 232c, the second electron transmission layer 232b and the first electron transmission layer 232a are arranged to be stacked in sequence in the direction close to the cathode 22. Alternatively, as shown in FIG. 5, the third electron transmission layer 232c, the first electron transmission layer 232a and the second electron transmission layer 232b are arranged to be stacked in sequence in the direction close to the cathode 22.

Optionally, the highest occupied molecular orbital HOMO1 of the third electron transmission layer 232c and the highest occupied molecular orbital HOMO2 of the basis material of the organic light-emitting layer 231 satisfy: |HOMO1−HOMO2|<1 eV, so that the third electron transmission layer 232c not only can transmit the electrons to the organic light-emitting layer 231, but also can block the holes from entering the electron transmission region 232 from the organic light-emitting layer 231, which is beneficial to control the recombination center of the electrons and the holes in the organic light-emitting layer 231, improve the luminescent effect of the organic light-emitting component 2, and improve the display effect of the organic light-emitting display panel.

Optionally, the lowest unoccupied molecular orbital LUMO1 of the basis material of one of the first electron transmission layer 232a and the second electron transmission layer 232b adjacent to the third electron transmission layer 232c and the lowest unoccupied molecular orbital LUMO2 of the third electron transmission layer 232c satisfy: |LUMO1−LUMO2|≤0.2 eV, so that the electrons can be easily transmitted to the third electron transmission layer 232c.

Optionally, the basis material of the second electron transmission layer 232b is the same as the material of the third electron transmission layer 232c, so that the vapor deposition process, when the second electron transmission layer 232b and the third electron transmission layer 232c are formed, is simple. When the third electron transmission layer 232c is adjacent to the second electron transmission layer 232b, it is better for improving the compatibility of the second electron transmission layer 232b and the third electron transmission layer 232c, and the electron injection barrier is the same, so that the electron transmission capacity of the electron transmission region 232 is good.

Figure 6:
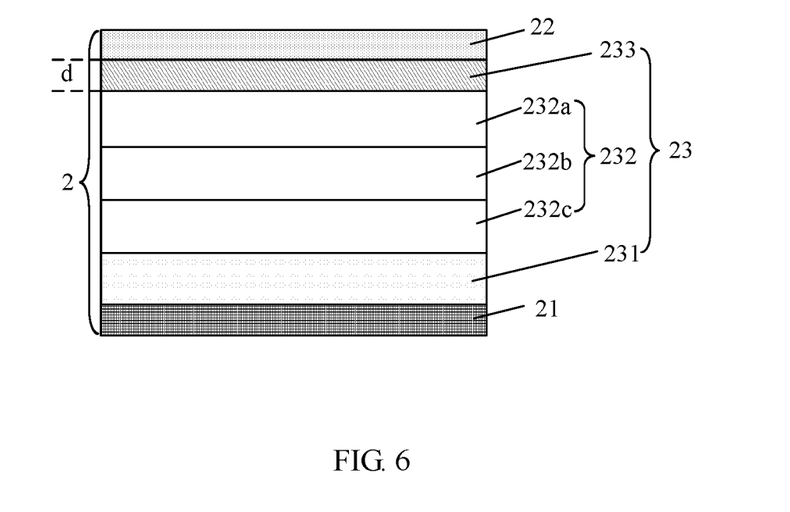
FIG. 6 illustrates a fifth cross-sectional view of an organic light-emitting component according to an embodiment of the present disclosure.
Figure 7:
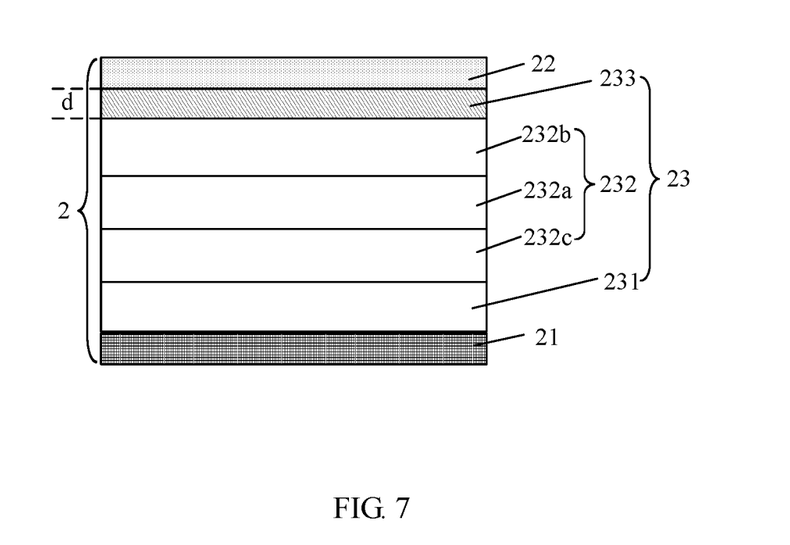
FIG. 7 illustrates a sixth cross-sectional view of an organic light-emitting component according to an embodiment of the present disclosure.

The inventor has found that, during usage of the organic light-emitting component 2, the holes are more easily to be injected and have larger transfer rate than the electrons, which may cause the recombination center of the holes and the electrons deviate from the organic light-emitting layer 231. In order to solve this problem, in the present disclosure, as shown in FIG. 6 and FIG. 7, FIG. 6 illustrates a fifth cross-sectional view of an organic light-emitting component according to an embodiment of the present disclosure, and FIG. 7 illustrates a sixth cross-sectional view of an organic light-emitting component according to an embodiment of the present disclosure. The organic light-emitting component 2 further includes an electron injection layer 233. The electron injection layer 233 is located between the cathode 22 and the electron transmission region 232, and the electron injection layer 233 is made of at least one of the alkaline earth metal or rare earth metal, so as to improve the electron injection capacity of the organic light-emitting component 2. It is better to let the recombination center of the electrons and the holes in the organic light-emitting layer 231, so as to improve the luminescent effect of the organic light-emitting component 2, reduce the working voltage of the organic light-emitting display panel, and increase the service life of the organic light-emitting component 2.

In the example shown in FIG. 6, the organic light-emitting component 2 includes an anode 21, an organic light-emitting layer 231, a third electron transmission layer 232c, a second electron transmission layer 232b, a first electron transmission layer 232a, an electron injection layer 233 and a cathode 22 arranged to be stacked in sequence. In the example shown in FIG. 7, the organic light-emitting component 2 includes an anode 21, an organic light-emitting layer 231, a third electron transmission layer 232c, a first electron transmission layer 232a, a second electron transmission layer 232b, an electron injection layer 233 and a cathode 22 arranged to be stacked in sequence.

Optionally, the thickness d of the electron injection layer 233 is d≤10 nm. Preferably, d≤5 nm, so that the arrangement of the electron injection layer 233 will not influence the recombination center of the holes and the electrons, thereby preventing the holes and the electrons from being recombined in positions out of the organic light-emitting layer 231. For example, the thickness d of the electron injection layer 233 satisfies e.g., d is 1 nm, 2 nm, 3 nm, 4 nm or 5 nm.

Optionally, the material of the electron injection layer 233 is the same as the material of the first dopant, so as to simplify the manufacturing method of the organic light-emitting display panel.

Of course, the organic light-emitting component 2 may not include the electron injection layer 233, in this situation, the cathode 22 is adjacent to the electron transmission region 232, rather than the metal layer, so that when the cathode 22 is formed by vapor deposition, the cathode 22 has better molding characteristics, that is, black spots will not easily occur due to accumulation of the cathode 22 material, thus the display effect of the organic light-emitting display panel is better.

From the above description, the selection of the first dopant has a large influence on the electron transmission capacity of the electron transmission region 232, in order for those skilled in the art to better understand and implement the technical solutions in the present disclosure, the possible materials of the first dopant will be illustrated by examples as below.

The inventor has found that, in order to better improve the electron transmission capacity of the electron transmission region 232 by the first dopant, the first dopant, the basis material of the first electron transmission layer 232a and the basis material of the second electron transmission layer 232b can satisfy one or more of the following conditions: (1) the difference between the lowest unoccupied molecular orbital of the basis materials of the first electron transmission layer 232a and the second electron transmission layer 232b and the work function of the first dopant is less than or equal to 0.3 eV; (2) the basis materials of the first electron transmission layer 232a and the second electron transmission layer 232b contain a group coordinating with the first dopant, taking Yb used as the first dopant as an example, the basis materials of the first electron transmission layer 232a and the second electron transmission layer 232b can include a compound containing N heterocyclic ring and its ramifications.

Optionally, the first dopant includes at least one of Mg, Ga, Yb, Sm, Y, Tm, Gd and Lu. In this case, the first dopant can be an elementary metal, or a compound (e.g., metal oxide or metal halide), or a complex, which will not be limited herein.

Optionally, the first dopant is an alkaline earth elementary metal, or a rare earth elementary metal. For example, the first dopant is elementary Mg, elementary Ga, elementary Yb, elementary Sm, elementary Y, elementary Tm, elementary Gd, or elementary Lu.

Optionally, the first dopant is a metal oxide containing alkaline earth metal elements or rare earth metal elements, or the first dopant is a metal halide containing alkaline earth metal elements or rare earth metal elements, or the first dopant is metal complex containing alkaline earth metal elements or rare earth metal elements. For example, the first dopant is magnesium oxide, calcium oxide, lithium fluoride or lithium quinoline.

In addition, the organic light-emitting component 2 can be a top emission organic light-emitting component (i.e., the light is emergent from the cathode), or a bottom emission organic light-emitting component (i.e., the light is emergent from the anode). For example, when the organic light-emitting component 2 is a top emission organic light-emitting component, the organic light-emitting component 2 includes a semi-transparent cathode 22 and a light-reflective anode 21. For example, the material of the cathode 22 is Ag with a small thickness to achieve semi-transparent, and the material of the anode is ITO/Ag/ITO. When the organic light-emitting component 2 is a bottom emission organic light-emitting component, the organic light-emitting component 2 includes a light-reflective cathode 22 and a transparent anode 21. For example, the material of the cathode 22 is Ag with a large thickness to achieve light reflection, and the material of the anode 21 is ITO. Optionally, the cathodes 22 of all the organic light-emitting components 2 are connected together to form an entire layer structure, so as to simplify the structure of the organic light-emitting display panel.

Of course, the organic light-emitting component 2 can further include one or more other structure. For example, a cap layer is provided at a side of the cathode 22 away from the anode 21, a hole transmission layer is provided between the anode 21 and the organic light-emitting layer 231, and a hole injection layer is provide between the anode 21 and the hole transmission layer, etc.

In addition, in the present disclosure, the organic light-emitting display panel includes a plurality of organic light-emitting components 2 having organic light-emitting components 2 emitting red light, organic light-emitting components 2 emitting green light and organic light-emitting components 2 emitting blue light, so that the light-emitting display panel can achieve full color display.

Since the wavelengths of the red light, green light and blue light are different, the requirements on at least one of the thickness of the electron transmission region 232 and the doping concentration of the first dopant in the electron transmission region 232 shall be different, therefore, the present disclosure provides three setting manners as follows:

Manner One: the first dopants in the electron transmission regions 232 of the organic light-emitting components 2 emitting red light, organic light-emitting components 2 emitting green light and organic light-emitting components 2 emitting blue light have doping concentrations different from one another, and the electron transmission regions 232 of the organic light-emitting components 2 emitting red light, organic light-emitting components 2 emitting green light and organic light-emitting components 2 emitting blue light have the same thickness.

Manner Two: the electron transmission regions 232 of the organic light-emitting components 2 emitting red light, organic light-emitting components 2 emitting green light and organic light-emitting components 2 emitting blue light have thicknesses different from one another, and the first dopant in the electron transmission regions 232 of the organic light-emitting components 2 emitting red light, organic light-emitting components 2 emitting green light and organic light-emitting components 2 emitting blue light have the same doping concentration.

Manner Three: the electron transmission regions 232 of the organic light-emitting components 2 emitting red light, organic light-emitting components 2 emitting green light and organic light-emitting components 2 emitting blue light have thicknesses different from one another, and the first dopants in the electron transmission regions 232 of the organic light-emitting components 2 emitting red light, organic light-emitting components 2 emitting green light and organic light-emitting components 2 emitting blue light have doping concentrations different from one another either.

Optionally, the thicknesses of the electron transmission regions 232 of the organic light-emitting components 2 emitting red light, organic light-emitting components 2 emitting green light and organic light-emitting components 2 emitting blue light can be reasonably selected in a range of 20 nm-50 nm, and the doping concentration of the first dopant in the electron transmission regions 232 of the organic light-emitting components 2 emitting red light, organic light-emitting components 2 emitting green light and organic light-emitting components 2 emitting blue light can be reasonably selected in a range of 1%-5%.

Figure 8:
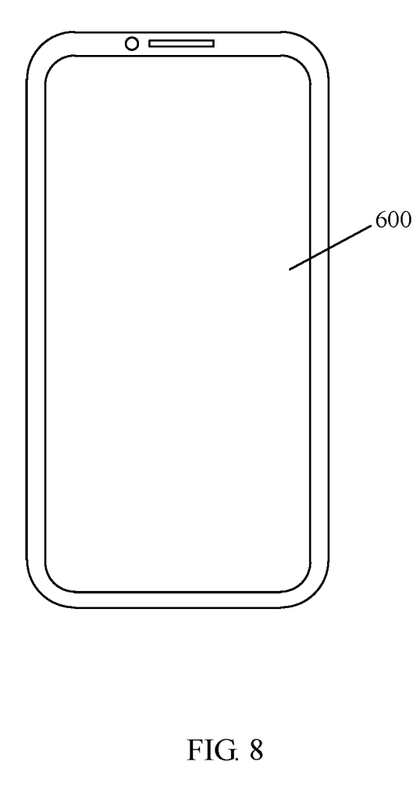
FIG. 8 illustrates a top view of an organic light-emitting display device according to an embodiment of the present disclosure.

In addition, an embodiment of the present disclosure provides an organic light-emitting display device, as shown in FIG. 8. FIG. 8 illustrates a top view of an organic light-emitting display device according to an embodiment of the present disclosure. The organic light-emitting display device includes any one of the above organic light-emitting display panels 600.

The organic light-emitting display device can be products or components having display function such as smart phone, wearable smart watch, smart glasses, tablet PC, television, displayer, laptop, digital photo frame, navigator, on-board displayer, e-book and the like. The display panel and display device provided by the present disclosure can be flexible or non-flexible, which will not be limited herein.

An embodiment of the present disclosure provides an organic light-emitting display panel and an organic light-emitting display device. The organic light-emitting display panel includes an electron transmission region 232 between the cathode 22 and the organic light-emitting layer 231. The electron transmission region 232 is doped with a first dopant, and the first dopant contains alkaline earth metal elements or rare earth metal elements. The electron transmission region 232 includes a first electron transmission layer 232a and a second electron transmission layer 232b. The doping concentration C1 of the first dopant in the first electron transmission layer 232a and the doping concentration C2 of the first dopant in the second electron transmission layer 232b satisfy: $0 \leq C2 < C1$, that is, the electron transmission region 232 is gradient-doped, so that the doping concentration at a side (one of the first electron transmission layer 232a and the second electron transmission layer 232b) of the electron transmission region 232 close to the cathode 22 is different from the doping concentration at a side (the other one of the first electron transmission layer 232a and the second electron transmission layer 232b) of the electron transmission region 232 close to the organic light-emitting layer 231, thus the electron transmission region 232 can be at the same time matched with the cathode 22 and the organic light-emitting layer 231 at two sides thereof, which is beneficial to improving the luminescent effect of the organic light-emitting component 2, and thus improving the display effect of the organic light-emitting display panel.

Finally, it should be noted that: the above embodiments are only used to illustrate the technical solutions of the present disclosure, rather than limiting; although the disclosure is illustrated in detail with reference to the above embodiments, person skilled in the art shall understand: they can still make modifications to the technical solutions recorded in the above embodiments, or make equivalent replacements to part or all of the technical features; however, these modifications or replacements will not let the essence of corresponding technical solutions depart from the scope of the technical solutions of the embodiments of the present disclosure.

What is claimed is:

1. An organic light-emitting display panel, comprising:
an array substrate comprising a plurality of driving elements; and
a plurality of organic light-emitting components arranged to be associated with the plurality of driving elements, wherein the organic light-emitting components each have an anode, a cathode and an organic functional layer arranged between the anode and the cathode, wherein the organic functional layer comprises an organic light-emitting layer and an electron transmission region arranged between the cathode and the organic light-emitting layer,
wherein the electron transmission region is doped with a first dopant, and the first dopant comprises alkaline earth metal elements or rare earth metal elements, and
wherein the electron transmission region comprises a first electron transmission layer and a second electron transmission layer, and a doping concentration C1 of the first dopant in the first electron transmission layer and a doping concentration C2 of the first dopant in the second electron transmission layer satisfy:

$0 < C2 < C1$,
wherein the first electron transmission layer is located between the second electron transmission layer and the cathode, and
wherein C2 is variable so that a doping concentration of the first dopant at a side of the second electron transmission layer close to the first electron transmission layer is higher than a doping concentration of the first dopant at a side of the second electron transmission layer away from the first electron transmission layer.

2. The organic light-emitting display panel according to claim 1, wherein the second electron transmission layer is undoped with the first dopant, and thus C2=0.

3. The organic light-emitting display panel according to claim 1, wherein C1 is variable so that a doping concentration of the first dopant at a side of the first electron transmission layer close to the cathode is higher than a doping concentration of the first dopant at a side of the first electron transmission layer away from the cathode.

4. The organic light-emitting display panel according to claim 1, wherein a basis material of the second electron transmission layer is the same as a basis material of the first electron transmission layer.

5. The organic light-emitting display panel according to claim 1, wherein the electron transmission region further comprises a third electron transmission layer adjacent to the organic light-emitting layer, and the third electron transmission layer is undoped with the first dopant.

6. The organic light-emitting display panel according to claim 5, wherein a highest occupied molecular orbital HOMO1 of the third electron transmission layer and a highest occupied molecular orbital HOMO2 of a host material of the organic light-emitting layer satisfy:
$|HOMO1-HOMO2| < 1$ eV.

7. The organic light-emitting display panel according to claim 5, wherein a basis material of the second electron transmission layer is the same as a basis material of the third electron transmission layer.

8. The organic light-emitting display panel according to claim 1, wherein the organic light-emitting component further comprises an electron injection layer arranged between the cathode and the electron transmission region, and the electron injection layer is made of an alkaline earth metal and/or a rare earth metal.

9. The organic light-emitting display panel according to claim 8, wherein a thickness of the electron injection layer is d, and $d \leq 5$ nm.

10. The organic light-emitting display panel according to claim 1, wherein the first dopant comprises at least one of Mg, Ga, Yb, Sm, Y, Tm, Gd or Lu.

11. The organic light-emitting display panel according to claim 1, wherein the first dopant is an alkaline elementary metal or a rare earth elementary metal.

12. The organic light-emitting display panel according to claim 1, wherein the first dopant is a metal oxide containing alkaline earth metal elements or rare earth metal elements, or the first dopant is a metal halide containing alkaline earth metal elements or rare earth metal elements, or the first dopant is metal complex containing alkaline earth metal elements or rare earth metal elements.

13. An organic light-emitting display device, comprising the organic light-emitting display panel according to claim 1.

14. An organic light-emitting display panel, comprising:
an array substrate comprising a plurality of driving elements; and a plurality of organic light-emitting components arranged to be associated with the plurality of driving elements, wherein the organic light-emitting components each have an anode, a cathode and an organic functional layer arranged between the anode and the cathode, wherein the organic functional layer comprises an organic light-emitting layer and an electron transmission region arranged between the cathode and the organic light-emitting layer, wherein the electron transmission region is doped with a first dopant, and the first dopant comprises alkaline earth metal elements or rare earth metal elements, and wherein the electron transmission region comprises a first electron transmission layer and a second electron transmission layer, and a doping concentration C1 of the first dopant in the first electron transmission layer and a doping concentration C2 of the first dopant in the second electron transmission layer satisfy:

0≤C2<C1, wherein the first electron transmission layer is located between the second electron transmission layer and the cathode, and wherein C1 is variable so that a doping concentration of the first dopant at a side of the first electron transmission layer close to the cathode is higher than a doping concentration of the first dopant at a side of the first electron transmission layer away from the cathode.

15. The organic light-emitting display panel according to claim 14, wherein the electron transmission region further comprises a third electron transmission layer adjacent to the organic light-emitting layer, and the third electron transmission layer is undoped with the first dopant.

16. The organic light-emitting display panel according to claim 15, wherein a highest occupied molecular orbital HOMO1 of the third electron transmission layer and a highest occupied molecular orbital HOMO2 of a host material of the organic light-emitting layer satisfy:

|HOMO1−HOMO2|<1 eV.

17. The organic light-emitting display panel according to claim 14, wherein the organic light-emitting component further comprises an electron injection layer arranged between the cathode and the electron transmission region, and the electron injection layer is made of an alkaline earth metal and/or a rare earth metal.

18. The organic light-emitting display panel according to claim 17, wherein a thickness of the electron injection layer is d, and d≤5 nm.

19. The organic light-emitting display panel according to claim 14, wherein the first dopant comprises at least one of Mg, Ga, Yb, Sm, Y, Tm, Gd or Lu.

20. An organic light-emitting display device, comprising the organic light-emitting display panel according to claim 14.

* * * * *